United States Patent [19]
Shao-Yi et al.

[11] Patent Number: 5,864,502
[45] Date of Patent: Jan. 26, 1999

[54] SENSING CIRCUIT FOR EEPROM

[75] Inventors: Wu Shao-Yi; Wang Fu-Chung, both of Hsinchu, Taiwan

[73] Assignee: Holtek Microelectronics, Inc, Hsinchu, Taiwan

[21] Appl. No.: 998,679

[22] Filed: Dec. 29, 1997

[30] Foreign Application Priority Data

Apr. 29, 1997 [TW] Taiwan ................................. 86105613

[51] Int. Cl.$^6$ ............................................. G11C 16/06
[52] U.S. Cl. ................................... 365/185.21; 365/185.2
[58] Field of Search ............................ 365/185.21, 185.2

[56] References Cited

U.S. PATENT DOCUMENTS 5,276,644 1/1994 Pascucci et al. .................... 365/189.01
5,621,686 4/1997 Alexis ................................. 365/185.21

Primary Examiner—Tan T. Nguyen
Assistant Examiner—Andrew Q. Tran
Attorney, Agent, or Firm—W. Wayne Liauh

[57] ABSTRACT

A sensing circuit for detecting data stored in a memory cell of an EEPROM by current detecting method is disclosed. The sensing circuit includes a constant current source supplying circuit for supplying a constant current. A loading circuit generates a current the same as the constant current generated by the current source supplying circuit when the memory cell sends out a logic low state signal, so that the data accessing speed during reading the data stored in the memory cell is increased.

4 Claims, 5 Drawing Sheets

SENSING CIRCUIT FOR EEPROM

BACKGROUND OF THE INVENTION

1. Field of the Invention

The present invention relates to a sensing circuit for a memory device, and more particularly to a current sensing type sensing circuit for reading data stored in an electrical erasable programmable memory (EEPROM).

2. Description of the Prior Art

It is known that an electrical erasable programmable memory (abbreviated EEPROM) includes a number of memory cells therein and is capable of storing data in the memory cells. The data stored in the EEPROM is either in the form of conductive or non-conductive state, and the data state may be sensed by a sensing circuit.

FIG. 1 is a schematic circuit diagram showing a conventional memory cell of an EEPROM. The memory cell 1 of the EEPROM is mainly composed of a MOS transistor 11 and an EEMOS transistor 12. The EEMOS transistor 12 serves as a storage element for the memory cell. The logic level at point VD is low voltage level when the memory cell circuit is in conductive status, which means that the data stored in the memory cell is logic low level "0". On the contrary, the point VD is at floating level when the memory cell circuit is in non-conductive status, which means that the data stored in the memory is logic high level "1".

A threshold voltage Vt of the EEMOS transistor determines whether the EEMOS transistor 12 is conductive or non-conductive. In case the threshold voltage Vt is larger than the gate voltage VG of the transistor, the EEMOS transistor will be non-conductive. On the contrary, in case the threshold voltage Vt is lower than the gate voltage VG of the transistor, the EEMOS transistor will be conductive. So, the data stored in the memory cell may be detected by a sensing circuit by detecting the voltage level at point VD.

During reading the data stored in the memory cell of the EEPROM, the relative points of the EEPROM memory cell are listed below:

| read mode | VG | VS | VD | VCG |
|---|---|---|---|---|
| 1 | 0 V | 0 V | 2 V | 5 V |
| 0 | 0 V | 0 V | 0 V | 5 V |

As mentioned above, the data stored in the memory cell may be read by a sensing circuit by sensing the voltage level of the memory cell of the EEPROM. Once the sensing circuit detects the data, the data will be sent to an amplifying circuit which is used to amplify the accessed data. Typically, the amplifying circuit is an inverted amplifying circuit.

FIG. 2 is a schematic circuit diagram of a prior art sense amplifying circuit, which mainly includes a PMOS transistor 21, a NMOS transistor 22, two inverters 23 and 24. The PMOS transistor 21 serves as a pull-up transistor. The gate of the NMOS 22 is controlled by a bias control signal CO. The source of the NMOS 22 is coupled to the memory cell of the EEPROM for receiving the data sent from the EEPROM.

In operation, the voltage level at intersection point between the PMOS 21 and the NMOS 22 may be charged or discharged by means of the operation of the PMOS 21 and the NMOS 22. The voltage level may be detected by the inverters 23 and 24. However, it is found that the sensing speed of this prior art sensing circuit is slow because that the voltage charging operation is limited. Especially, the discharging speed of the memory cell is rather slow during detecting logic level "0" because that the discharging speed of the circuit is low.

SUMMARY OF THE INVENTION

For obviating the aforementioned problem and drawback found in the prior art sensing circuit, it is the primary object of the present invention to provide an improved sensing circuit for EEPROM. By means of the improvement of sensing circuit in accordance with the present invention, the operation speed of the memory cell may be increased.

The other object of the present invention is to provide a current detecting type sensing circuit for EEPROM. The present invention detects the data stored in memory cell by means of current detecting method, instead of voltage detecting method. So, the operation speed of the present invention is higher than that of the prior art sensing circuit. In the sensing circuit of the present invention, it includes a set of current mirror circuits which is capable of providing a constant current during a logic level "0" is presented in the memory cell.

In order that the present invention may more readily be understood, the following description is given, merely be way of example, reference being made to the accompanying drawings, wherein:

DETAIL DESCRIPTION OF THE PREFERRED EMBODIMENT

Reference will now be made in detail to the present preferred embodiment of the invention as illustrated in the accompanying drawings.

Figure 3:
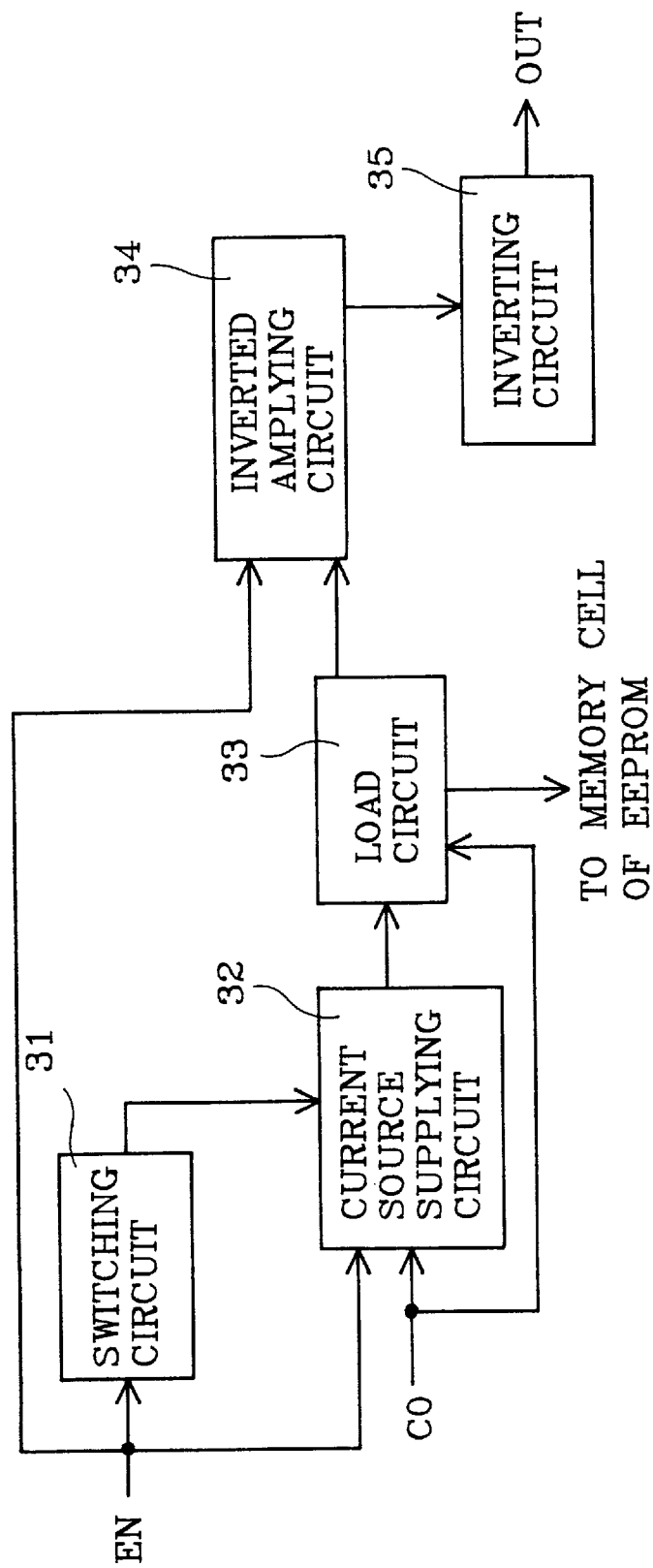
FIG. 3 is a functional circuit diagram in accordance with the present invention.
Figure 4:
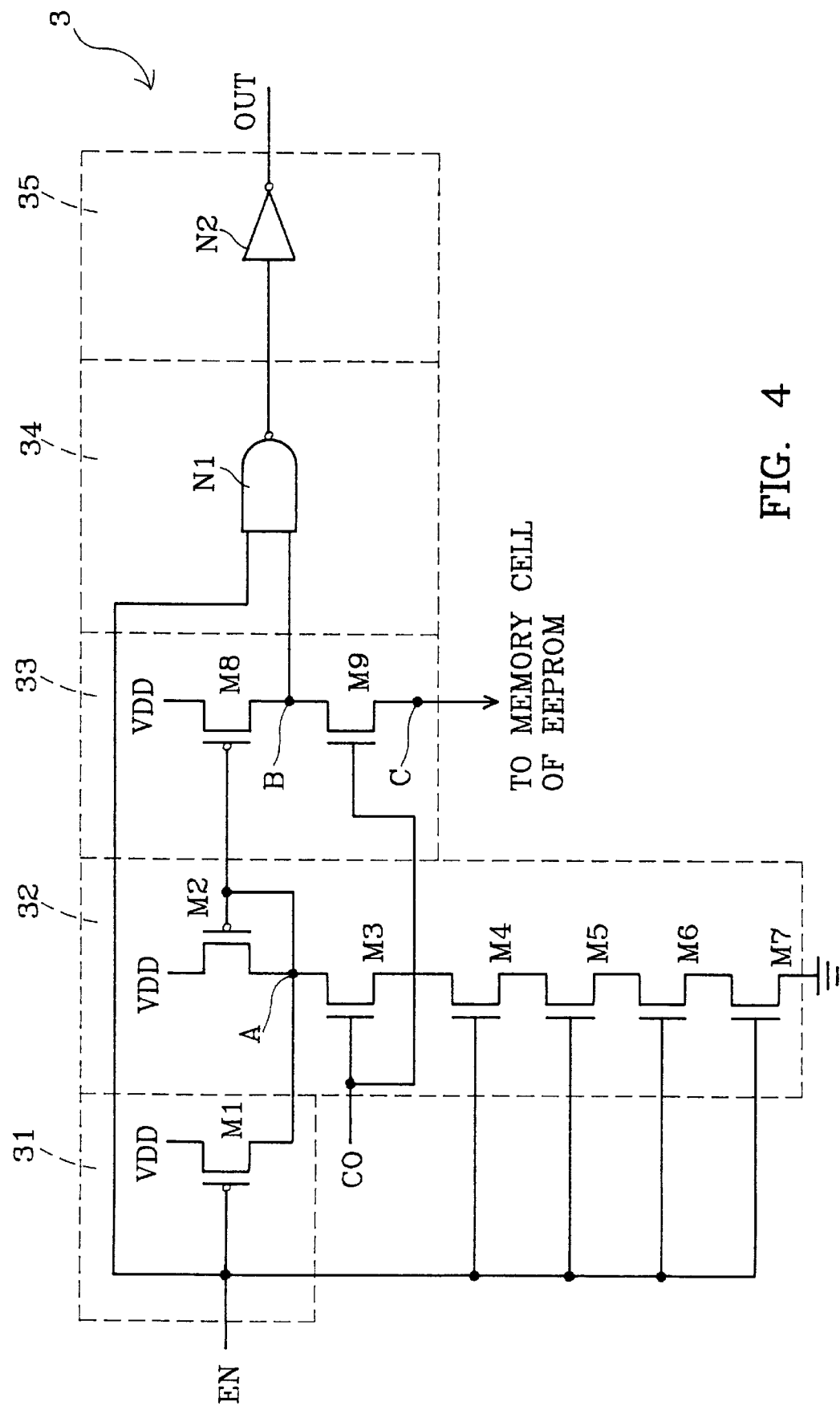
FIG. 4 is a schematic circuit diagram of the sensing circuit in accordance with a preferred embodiment of the present invention.

FIG. 3 is a schematic circuit diagram showing the sensing circuit of the present invention. The sensing circuit 3 includes a switching circuit 31, a current source supplying circuit 32, a loading circuit 33, an inverted amplifying circuit 34, and an inverting circuit 35. FIG. 4 is a schematic circuit diagram of the sensing circuit in accordance with a preferred embodiment of the present invention.

The switching circuit 31 includes a PMOS transistor M1 serving as a control element of the current source for enabling the operation of the sensing circuit 3. The source of the transistor M1 is electrically connected to a high voltage level VDD, the Drain of the transistor M1 is electrically connected to point A (i.e. the drain of PMOS transistor M2) of the current source supplying circuit 32, and the gate of the transistor M1 is electrically connected to an initial control signal EN. When the initial control signal EN is at logic low state, the sensing circuit 3 is disable. At this time, the PMOS transistor M1 is conductive so that the source supplying circuit 32 does not supply current source. On the contrary, when the initial control signal EN is at logic high state, the transistor M1 in switching circuit 31 is non-conductive.

The current source supplying circuit 32 is capable of supplying a constant current source which is used to provide the desired current source during sensing the low level signal "0" of the memory cell of the EEPROM. The current source supplying circuit 32 is composed of a PMOS transistor M2 and a series of NMOS transistors M3 through M7 connected in series. The series transistors M2 through M7 substantially is a resistor circuit which has a function of supplying a constant current source.

The source of the PMOS transistor M2 of the current source supplying circuit 32 is connected to a high voltage signal VDD, and the drain and gate of which are connected together to drain of the NMOS transistor M3. In addition, the drain and gate of the PMOS transistor M2 are connected to gate of the NMOS transistor M8 of the loading circuit 33 to form a current mirror circuit.

In the series NMOS transistor M3 through M7, the gate of the NMOS transistor M3 is connected to a biasing signal CO, the source of which is connected the drain of the NMOS transistor M4. The source of the NMOS transistor M4 is connected to the drain of the NMOS transistor M5. The source of the NMOS transistor M5 is connected to the drain of the NMOS transistor M6. The source of the NMOS transistor M4 is connected to the drain of the NMOS transistor M5. The source of the NMOS transistor M6 is connected to the drain of the NMOS transistor M7. The source of the NMOS transistor M7 is connected to a low voltage signal.

All the gates of the NMOS transistor M4, M5, M6, and M7 are connected to the initial control signal EN. When the initial control signal EN is at logic high level state, the PMOS transistor M2 and the NMOS transistors M3 through M7. When the initial control signal EN is at high level state, the PMOS transistor M2 and NMOS transistors M3 through M7 together form an equivalent resistor circuit which is capable of supplying a constant current source.

The loading circuit 33 is capable of generating a desired voltage for the amplifying circuit 34, which is composed of a PMOS transistor M8 and a NMOS transistor M9. The PMOS transistor M8 serves as a pull-up transistor, having its source connected to a high voltage level signal VDD and having its drain connected to one input terminal of a NAND gate of the amplifying circuit 34. The drain of the PMOS transistor M8 is also connected to the drain of the NMOS transistor M9. The gate of the PMOS transistor M8 is connected to the drain of the PMOS transistor M2 of the current source supplying circuit 32 so as to form a current mirror circuit with the PMOS transistor M2. The current mirror circuit is capable of pulling down the voltage level at point B during the memory cell of the EEPROM sends out a low level signal "0". When the voltage level at point A is pulled down to a logic level state below the threshold transferring point of the amplifying circuit 34, the amplifying circuit 34 will send out a high level signal at its output terminal.

When the memory cell of the EEPROM is at floating state, the PMOS transistor M8 will be conductive. At this time, the point A between the transistors M8 and M9 is at logic high level state, such that the amplifying circuit 34 will send out a low level signal at its output terminal.

Figures 1, 2:
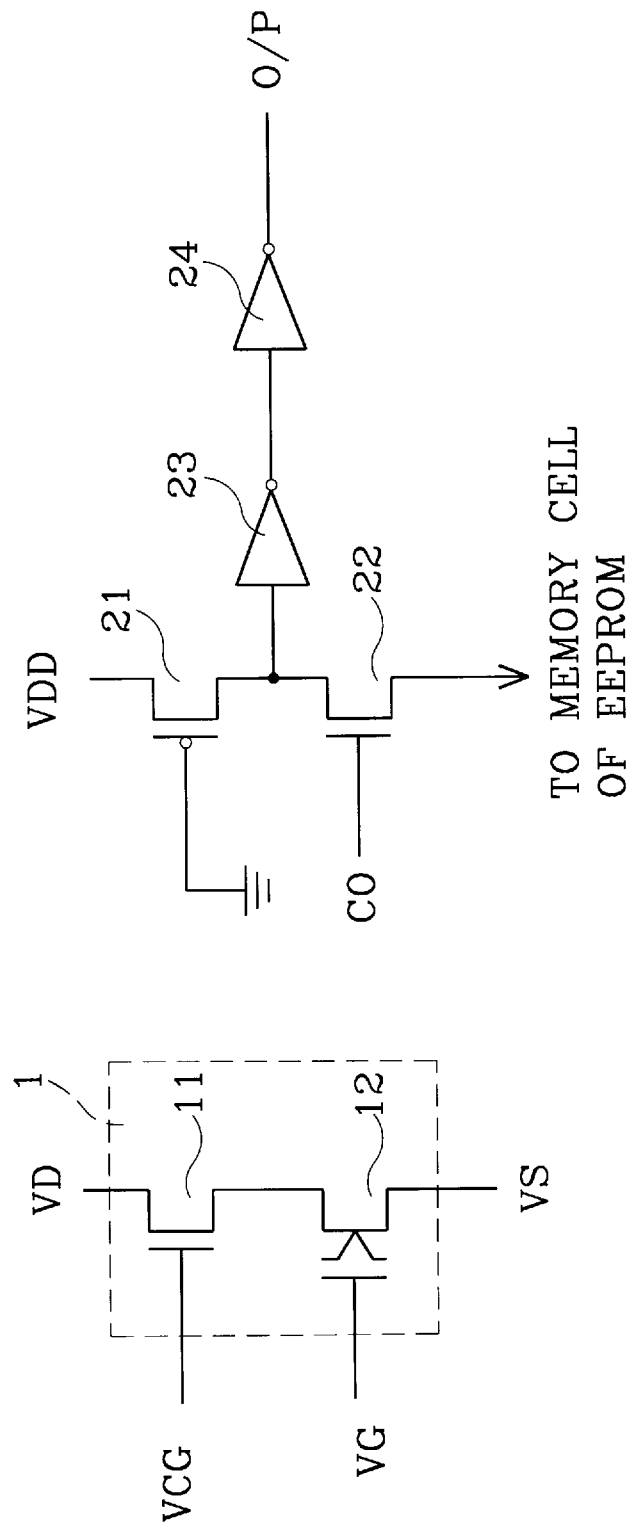
FIG. 1 is a schematic circuit diagram showing a basic circuit arrangement of a memory cell of a prior art EEPROM.
FIG. 2 is a schematic circuit diagram of a prior art sensing circuit for EEPROM.

The source of the NMOS transistor M9 is connected to the memory cell of the EEPROM. The gate of the NMOS transistor M9 is connected to the biasing signal CO which is capable of controlling the operation of the NMOS transistor M9. The purpose of this circuit arrangement is to provide a voltage level of 2V to terminal VD (with reference to FIG. 1) of the memory cell of the EEPROM during reading the data signal "1" of the memory cell.

The amplifying circuit 34 is used to amplify the output signal sent from the loading circuit 33. The amplifying circuit 34 includes a NAND gate N1. One input terminal of the NAND gate N1 is connected to the initial control signal EN, and the other input terminal of which is connected to point B, i.e. the drain of the PMOS transistor M8, in the loading circuit 33. The output terminal of the NAND gate N1 is connected to the input terminal of an inverter N2 of the inverting circuit 35.

The inverting circuit 35 includes a NOT gate N2 used to invert the amplified output signal sent from the amplifying circuit 34 to generate a proper output signal at its output terminal.

Figure 5A:
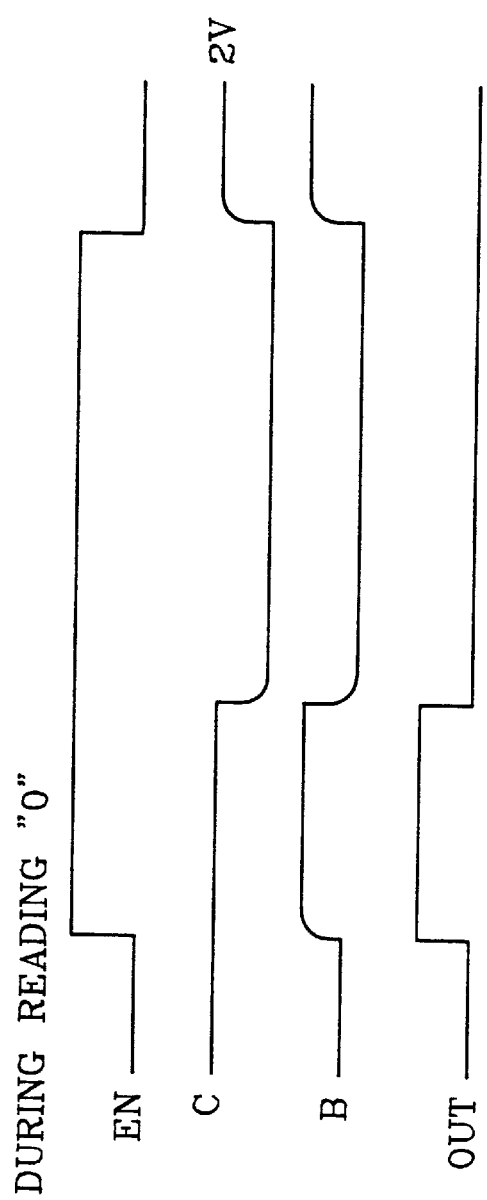
FIG. 5A shows a timing diagram of the present invention during reading data "0" stored in the memory cell.
Figure 5B:
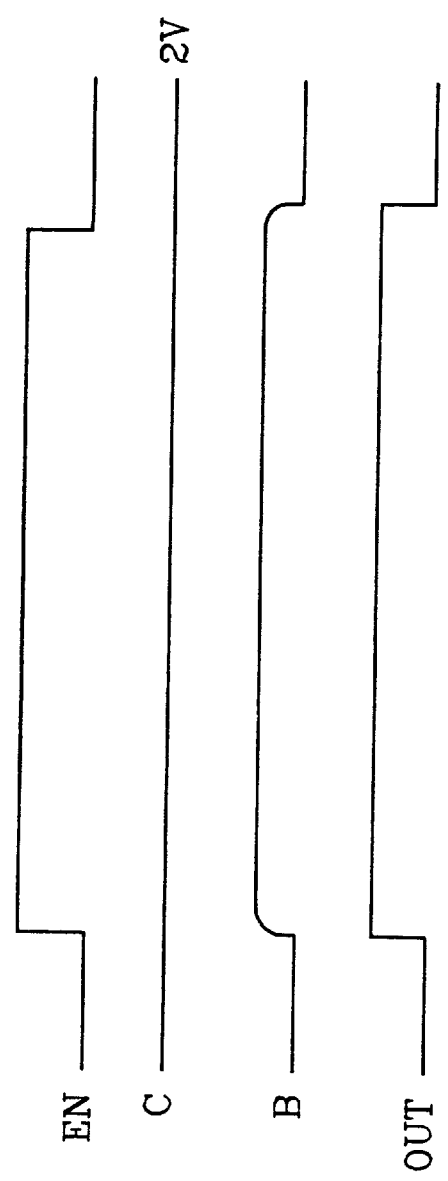
FIG. 5B shows a timing diagram of the present invention during reading data "1" stored in the memory cell.

FIG. 5A is a timing diagram of relative signals shown in FIG. 4 during the sensing circuit reads a data signal "0" from the memory cell of EEPROM. FIG. 5B is a timing diagram of relative signals shown in FIG. 4 during the sensing circuit reads a data signal "1" from the memory cell of EEPROM. The operation of the present invention will be further described below with reference to FIG. 4, FIG. 5A and FIG. 5B.

In operation, when the initial control signal EN is at high level state, the switching circuit 31 is non-conductive, so that the current source supplying circuit 32 is operated to supplying a constant current source. In case that the memory cell of the EEPROM sends out a data with logic low level signal "0", the loading circuit 33 will be operated to generate a current same to the constant current source generated by the current source supplying circuit 32. At this time, the voltage level at point A will be pulled down to a low level state. When the low level state at point A is pulled down to a level lower than an threshold transferring point of the amplifying circuit 34, the amplifying circuit 34 will generate a high level output signal. The output signal of the amplifying circuit 34 will be further inverted by the inverting circuit 35, so that the inverting circuit 35 will generate a low level signal at its output terminal.

In case that the memory cell of the EEPROM sends out a data with logic floating level signal, the PMOS transistor M8 of the loading circuit 33 will be operated to pull-up the voltage level at point B to a logic high level state. When the high level state at point B is higher than an threshold transferring point of the anplifying circuit 34, the amplifying circuit 34 will generate a low level output signal. The output signal of the amplifying circuit 34 will be further inverted by the inverting circuit 35, so that the inverting circuit 35 will generate a high level signal at its output terminal.

As described above, the gate of the NMOS transistor M9 of the loading circuit 3 is connected to a biasing signal CO so as to limit the voltage level at point C to 2V. This purpose of circuit arrangement is to keep the voltage level at about 2V at terminal VD (with reference to FIG. 1) and further keep the electric reliability of the circuit.

Figure 6:
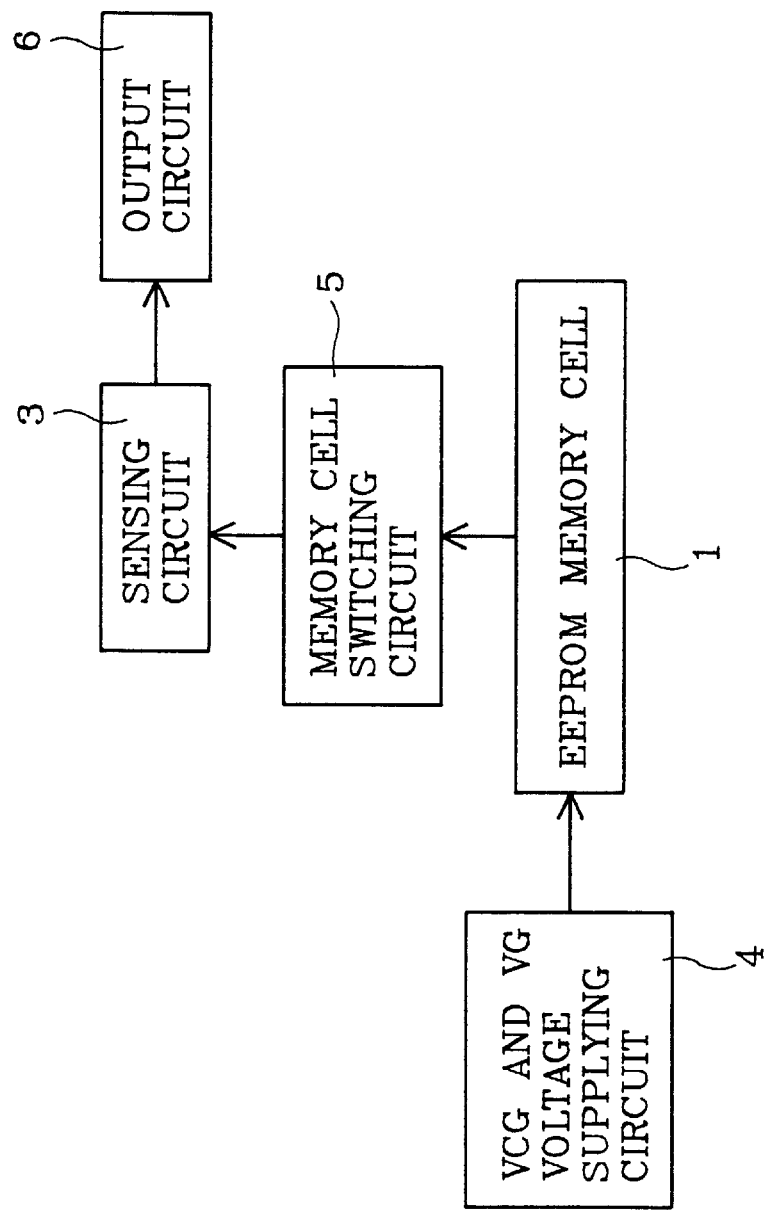
FIG. 6 is functional block diagram showing the connection of the sensing circuit with the memory cell of an EEPROM.

FIG. 6 is a functional block diagram showing the relative connection between the sensing circuit and the memory cell of the EEPROM. As shown in the drawing, a VCG and VG voltage supplying circuit 4 is electrically coupled to the EEPROM memory cell 1 for the purpose of supplying a voltage signal 5V to VCG and a voltage signal 0V to VG shown in FIG. 1 during accessing the data stored in the EEPROM memory cell. A memory cell switching circuit 5 serves as a switch to select the memory cell of the EEPROM during accessing the data of the memory cell.

With reference to FIG. 5A which shows the timing diagram of the present invention during reading "0" of the memory cell. When the memory cell of the EEPROM sends out a data signal with logic low level state, the data will be transmitted to the sensing circuit 3 via the memory cell switching circuit 5. The sensing circuit 3 receives the data and then supply the data to an output circuit 6.

With reference to FIG. 5B which shows the timing diagram of the present invention during reading "1" of the memory cell. When the memory cell of the EEPROM sends out a data signal with logic floating level state, the memory cell switching circuit 5 will be operated first. At this time, the sensing circuit 3 of the present invention is capable of supplying a voltage 2V to the memory cell of the EEPROM, so that the output signal of the memory cell will be at voltage level of 2V. The sensing circuit 3 will detect a logic high level signal and then supply the data to the output circuit 6.

It is apparent that although the invention has been described in connection with a preferred embodiment, those skilled in the art may make changes to certain features of the preferred embodiment without departing from the spirit and scope of the invention as defined in the appended claims.

We claim:

1. A sensing circuit for detecting data stored in a memory cell of an EEPROM and then supplying an output data responding to the detected data, comprising:

a current source supplying circuit supplying a constant current during detecting the output signal of the memory cell of the EEPROM of a logic low state;

a switching circuit controlling if the current source supplying circuit supplies the constant current under control of an initial control signal;

a load circuit having an output terminal and a signal input terminal which is connected to the memory cell of the EEPROM for receiving the output signal sent from the memory cell, said load circuit generating a current the same as the constant current of the current source supplying circuit when the memory cell sends out a logic low state signal and the current source supplying circuit supplies the constant current;

an inverted amplifying circuit coupled to the output terminal of the load circuit for receiving and amplifying the output signal from the output terminal of the load circuit, the inverted amplifying circuit comprising an inverted AND gate having a first input terminal for receiving the initial control signal and a second input terminal connected to the output terminal of the load circuit; and an inverting circuit connected to the output terminal of the inverted amplifying circuit to output the output data identical to the data stored in the memory cell of the EEPROM.

2. The sensing circuit as claimed in claim 1, wherein the switching circuit comprises a PMOS transistor having its source terminal connected to a high voltage level and having its gate terminal connected to the initial control signal, the PMOS transistor being controlled by the initial control signal.

3. The sensing circuit as claimed in claim 1, wherein the current source supplying circuit comprises: a PMOS transistor and a plurality of NMOS transistors connected in series, the PMOS transistor having its source terminal connected to a high voltage signal and having its drain terminal and the gate terminal being connected to the drain terminal of the first NMOS transistor of the series NMOS transistors, the gate terminal of the first NMOS transistors being connected to a bias signal which is used to control the first NMOS transistor and the gate terminals of the other NMOS transistors in the series connected NMOS transistors being connected to the initial control signal, the PMOS transistor and the series NMOS transistors forming a series loop for supplying a constant current source for the current source supplying circuit when the initial control signal is in a logic high state.

4. The sensing circuit as claimed in claim 3, wherein the load circuit comprises a second PMOS transistor and a second NMOS transistor, the second PMOS transistor having its source terminal connected to said high voltage signal and having its gate terminal connected to the drain terminal of the PMOS transistor of the current source supplying circuit to form a current mirror circuit; the source terminal of the second NMOS transistor is connected to the memory cell of the EEPROM for receiving the output data from the memory cell, the gate terminal of the second NMOS transistor being connected to said bias signal to control the second NMOS transistor so that the voltage at the intersection point between the source terminal of the second NMOS transistor and the memory cell of the EEPROM remains at a voltage level of 2V.

* * * * *